(12) United States Patent
Lamanna et al.

(10) Patent No.: US 8,638,146 B1
(45) Date of Patent: Jan. 28, 2014

(54) DUAL MODE PHASE DETECTION

(75) Inventors: Pasquale Lamanna, Cannes (FR); Davide Orifiamma, Valbonne (FR)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/562,770

(22) Filed: Jul. 31, 2012

(51) Int. Cl.
*H03L 7/06* (2006.01)
(52) U.S. Cl.
USPC ............. 327/159; 327/156; 331/17; 375/376
(58) Field of Classification Search
USPC ............. 327/2, 3, 5, 7–10, 12, 147, 150, 156, 327/159; 331/17, 25; 375/373, 376
See application file for complete search history.

(56) References Cited

U.S. PATENT DOCUMENTS

| 7,714,668 | B2 * | 5/2010 | Yoshida et al. | 331/16 |
| 8,427,243 | B2 * | 4/2013 | Chen et al. | 331/1 A |
| 2010/0195779 | A1 * | 8/2010 | Sai | 375/376 |
| 2013/0057327 | A1 * | 3/2013 | Ferriss et al. | 327/156 |

* cited by examiner

*Primary Examiner* — Patrick O'Neill
(74) *Attorney, Agent, or Firm* — Lando & Anastasi, LLP

(57) ABSTRACT

A method of measuring a phase difference for use in a phase locked loop (PLL) that includes a binary phase detector (BPD), a time-to-digital converter (TDC) and a signal generator, the phase difference being that between a reference signal and a generated signal output from the signal generator. The method includes inputting the reference signal and the generated signal into the TDC; measuring the magnitude of the phase difference at the TDC; if the measured magnitude of the phase difference is less than a threshold value, operating the PLL according to a first operational mode in which the output of the BPD controls the signal generator; and if the measured magnitude of the phase difference is greater than the threshold value, operating the PLL according to a second operational mode in which the output of the TDC and the BPD controls the signal generator.

16 Claims, 5 Drawing Sheets

DUAL MODE PHASE DETECTION

FIELD OF DISCLOSURE

This invention relates to a dual mode digital phase detector for use with a local oscillator with a software defined response.

BACKGROUND

In recent years there has been a much increased demand for devices with wireless functionality, for example WI-FI, Bluetooth and GPS. In most wireless communication systems, information is transmitted at a much higher frequency than the signal bandwidth. Reducing the wavelength information is transmitted at often increases the effectiveness of the communication. For example, in wireless communications devices decreasing the wavelength of the transmitted signal allows the antenna of the receiver device to be made smaller. The frequency at which information is transmitted is known as the carrier frequency. A phase-locked loop (PLL) is commonly used to generate this carrier frequency. An example of a typical PLL is shown in FIG. 1. A reference signal $S_{ref}$ with frequency $F_{ref}$ and a second signal $S_O$ are input into a phase detector module 101. The phase difference is output as a signal e(t) which in turn is input into a filter 102. The output signal from the filter v(t) is input into a voltage-controlled oscillator (VCO) 103 which, in response to the input signal, outputs a signal $S_O$. The signal $S_O$ is then fed back into the phase detector along with the reference signal $S_{ref}$. The PLL acts as a feedback loop whereby the measured phase difference between the generated signal and a reference signal is used to drive the oscillator that outputs the generated signal. If the phase detector measures a phase difference between the two input signals, it outputs an error signal in dependence on this difference. The error signal is input into the loop filter and the signal output from the loop filter is input into the VCO. The VCO will then generate a signal with a frequency that is closer to the reference frequency which will reduce the phase difference.

When the phase difference between the signal generated by the VCO and the reference signal is small and measured errors cause the VCO to bring the frequency of its output signal back towards the reference signal, the generated signal is said to be locked-on to the reference signal. In this mode if the frequency of the reference signal changes, the measured error signal can cause the VCO to generate a signal with a frequency that tracks that of the reference signal. When this happens the PLL is said to be in "tracking mode". When the PLL is in tracking mode it is also locked on to the reference signal. If the PLL is in "acquisition mode" the PLL is not locked on to the reference signal. This could be because lock-in has yet to be achieved or because the VCO has received an instantaneous frequency kick. Frequency kicks can be caused by, for example, the dynamic variation of the output impedance of the VCO; from supply pulling or from substrate pushing. Substrate pushing is the effect of signals from one node of an integrated circuit coupling to another node via the substrate of the circuit. Supply pulling describes the effect of the output frequency of the VCO changing in response to a change in load of the output signal In "acquisition mode" the measured phase error between the output signal from the VCO and the reference signal is relatively large. The time taken for a PLL to achieve lock-in from an unlocked state is called the lock-in time. If the PLL is locked on to the reference signal and the controlled oscillator receives an instantaneous frequency kick, the subsequent behaviour of the PLL is called the step response. An important factor in the step response is the time taken for the PLL to once again lock-on to the reference signal.

The phase detector, filter and VCO are each associated with a "gain". The gain helps to define the relationship between the input signal and output signal of a component of the PLL. The relationship between the input and output signals of the phase detector, filter and VCO may be given by the following respective equations:

$$e(t) = K_{pd} f_1(\Delta\phi)$$

$$v(t) = K_{filter} f_2(\Delta\phi)$$

$$S_1 = K_{VCO} f_3(v(t))$$

where $k_{pa}$, $K_{filter}$ and $K_{VCO}$ are the gains of the phase detector, filter and VCO respectively, $\Delta\phi$ is the measured phase difference and $f_1$, $f_2$ and $f_3$ are functions. In phase detectors with a linear response, $f_1(\Delta\phi) = \Delta\phi$.

Recent developments have focussed on digital PLLs due to their improved scalability as circuit components shrink in size. An example of a digital PLL is shown in FIG. 2. The circuit operates in the same manner as the circuit depicted in FIG. 1, with a Time-to-Digital Converter (TDC) 201 performing the function of phase comparison between the reference signal and the generated signal. The loop filter and controlled oscillator of FIG. 1 have also been replaced by their digital equivalents; a digital loop filter (DLF) 202 and a digitally controlled oscillator (DCO) 203 respectively. Each of the components will have a gain associated with them. A TDC measures the time difference between two signals. In a typical application of a TDC in a PLL, one of the signals is delayed multiple times relative to the reference signal. After each time the signal has been delayed it is determined whether the rising edge of that signal is ahead or behind of the rising edge of the reference signal. If the signal is ahead of the reference signal, a digital counter is incremented, whereas if the signal is behind the reference signal the counter is not incremented. This process is illustrated in FIGS. 3a and 3b. FIG. 3a shows a reference signal $S_{ref}$ and a generated signal $S_O$. The time difference between the rising edges of the signals is given by $\Delta T_0$. The rising edge of signal $S_O$ passes a fixed reference point X in advance of the rising edge of signal $S_{ref}$, and so the digital counter is incremented. The signal $S_O$ is then delayed relative to the reference signal by an amount $\Delta T_1$, to produce signal $S_1$. The rising edge of signal $S_1$ still passes the point X in advance of the rising edge of the reference signal, and so the digital counter is again incremented. Signal $S_1$ is then delayed relative to the reference signal by an amount $\Delta T_2$, to produce signal $S_2$ which causes the digital counter to be incremented once again. Delaying signal $S_2$ by an amount $\Delta T_3$ does not cause the counter to be further incremented because the rising edge of the resulting signal $S_3$ passes the point X after the rising edge of the reference signal. FIG. 3b is an illustration of the digital output of the TDC for a time error $\Delta T_0$ between a reference signal and generated signal. Because of the simple relationship between the time delay between two signals and the corresponding phase difference, it is possible to determine the digital output of the TDC for a particular phase difference between two signals if the temporal difference is known. An example of such an output is shown in FIG. 3b.

It can be seen with reference to FIG. 3a that delaying the signal relative to the reference signal by a quantized amount introduces an error, $\Delta T_E$. It is not possible for the TDC to determine where within the time period $\Delta T_3$ the rising edges of the reference signal and the generated signal overlap, meaning it is not possible to fully determine the value of $\Delta T_0$. Mathematically we have the relationship:

$$\Delta T_0 = \Delta T_1 + \Delta T_2 + \Delta T_3 \pm \Delta T_E$$

In order to improve the temporal resolution it is therefore necessary to decrease the size of the delay periods $\Delta T_n$. However each delayed signal is generated by a digital delay gate, and so in order to increase the resolution whilst maintaining the range of initial time differences that the TDC is able to detect, it is necessary to increase the number of delay gates. This would lead to an increase in occupied chip area and a more power-hungry circuit. A further potential problem with the TDC is that if the delay periods $\Delta T_n$ are not constant then the linearity of the relationship between the output of the TDC and the measured time difference is reduced.

Alternatively a digital PLL may implement a Binary Phase Detector (BPD) instead of a TDC. Unlike a TDC, a BPD can generally only determine the polarity of the phase difference between a generated signal and a reference signal; that is, whether the rising edge of the generated signal passes before or after the rising edge of the reference signal. The magnitude of the difference remains unknown. FIG. 4 shows the output of a BPD as a function of phase difference. Because the BPD output is a non-linear function of the phase difference, the output signal of the controlled oscillator is oscillatory when the PLL is in a phase tracking mode. The non-linear behaviour also means that PLLs with BPDs are not able to be analysed using linear analysis techniques, which can make their design more difficult to optimise. Despite these potential drawbacks, BPDs are often used in digital PLLs because they are capable of achieving a very high temporal resolution in the range of 0.2 ps. It is therefore easier to implement a PLL with a high temporal resolution using a BPD than it is with a TDC. However, BPDs typically limit the capture range of the PLL to approximately 10% of the controlled oscillator's free-running frequency. The capture range is defined as the maximum difference in frequency between the two signals input into phase detector that will still result in the PLL being able to lock onto the reference frequency. Furthermore when the PLL is not locked and the phase difference between the generated signal and the reference signal is relatively large, the gain of the BPD is significantly reduced. This results in the step response of the loop being reduced.

It is desirable to produce a PLL which has a large capture range and high temporal resolution without the burden of significantly increasing the circuit size and complexity. There is thus a need for improved phase detection for use in PLLs.

SUMMARY OF INVENTION

According to a first embodiment of the present invention there is provided a method of measuring a phase difference for use in a phase locked loop (PLL) comprising a binary phase detector (BPD), a time-to-digital converter (TDC) and a signal generator, the phase difference being that between a reference signal and a generated signal output from the signal generator, the method comprising: inputting the reference signal and the generated signal into the TDC; measuring the magnitude of the phase difference at the TDC; if the measured magnitude of the phase difference is less than a threshold value, operating the PLL according to a first operational mode in which the output of the BPD controls the signal generator; and if the measured magnitude of the phase difference is greater than the threshold value, operating the PLL according to a second operational mode in which the output of the TDC and the BPD controls the signal generator.

The PLL may further comprise a loop filter, and the method may further comprise altering the gain of the loop filter in dependence upon the measured phase difference.

The threshold value may be equal to the resolution of a minimum phase difference detectable by the TDC.

The value of the minimum phase difference may be at least as great as the value of the 10th standard deviation of the PLL phase noise distribution.

The loop filter may be a digital loop filter.

A dynamic function unit may determine the gain of the loop filter as a function of the magnitude of the measured phase difference and, in response to the determination, signal the determined gain to the loop filter.

The gain of the loop filter as a function of the determined phase difference determined by the dynamic function unit could be programmable.

The dynamic function unit could determine the gain of the loop filter as a function of the measured magnitude of the phase difference using a look-up table, and the look-up table could be re-configurable.

According to a second embodiment of the present invention there is provided an apparatus for measuring a phase difference for use in a phase locked loop (PLL) comprising a binary phase detector (BPD), time-to-digital converter (TDC) and a signal generator, the phase difference being that between a reference signal and a generated signal output from the signal generator, wherein: the TDC is configured to receive the reference signal and the generated signal and to measure the phase difference between these signals; if the measured phase difference is less than a threshold value, the apparatus operates the PLL according to a first operational mode in which the output of the BPD controls the signal generator; and if the measured phase difference is greater than the threshold value, the apparatus operates the PLL according to a second operational mode in which the output of the BPD and the TDC controls the signal generator.

The apparatus may further comprise a loop filter, the loop filter having a gain that is alterable in dependence upon the measured magnitude of the phase difference.

The threshold value used by the TDC could be equal to the resolution of the minimum phase difference detectable by the TDC. The value of the minimum phase difference could be at least as great as the value of the 10th standard deviation of the PLL phase noise distribution.

The loop filter of the apparatus could be a digital loop filter.

The apparatus could further comprise a dynamic function unit that determines the gain of the loop filter as a function of the measured phase difference and, in response to the determination, could signal the determined gain to the loop filter.

The gain of the loop filter as a function of the determined phase difference determined by the dynamic function unit could be programmable.

The dynamic function unit of the apparatus could determine the gain of the loop filter as a function of the measured phase difference by using a look-up table. The look-up table could be re-configurable.

BRIEF DESCRIPTION OF THE DRAWINGS

The present disclosure will now be described by way of reference to the following drawings. In the drawings.

DETAILED DESCRIPTION

Figure 5:
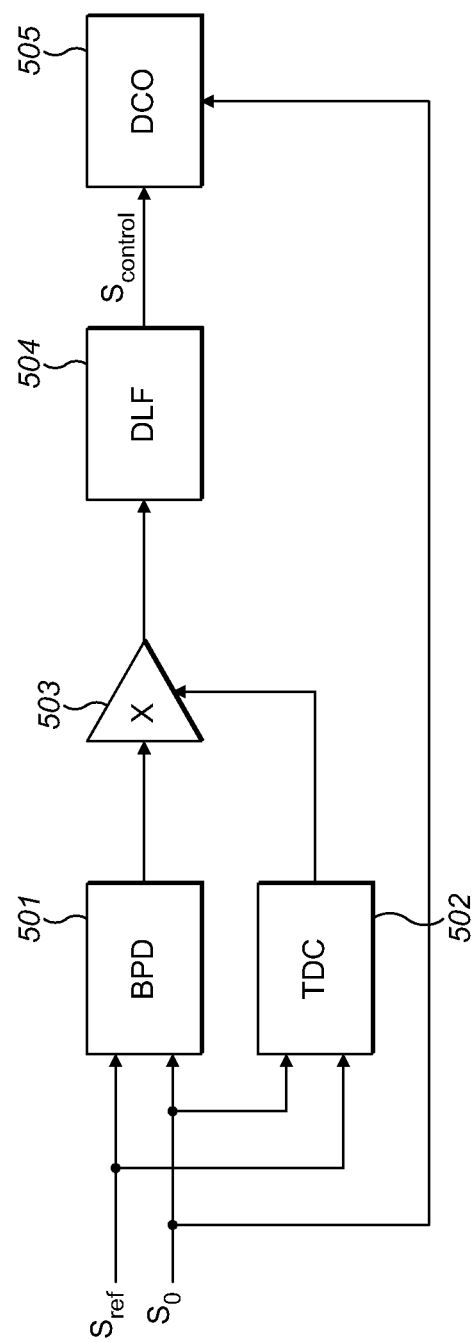
FIG. 5 is a diagram of the components used to measure the phase difference between a generated signal and a reference signal in accordance with an embodiment of the present invention.

Dividing the phase detection module of a PLL into two sub-modules allows each module to handle a separate phase detection problem. The resulting architecture enables the PLL to operate with improved performance over a wider range of detected phase errors compared to architectures comprising a TDC or BPD in isolation. An example of a phase detection module according to an embodiment of the present invention is shown in FIG. 5. A signal $S_0$ output from a signal generator (e.g. a controlled oscillator) and a reference signal $S_{ref}$ are input into a binary phase detector 501 and a time-to-digital converter 502. The output signals from the BPD and TDC are input into multiplier 503. The output signal from the multiplier is input into a digital loop filter (DLF) 504. The DLF outputs a signal $S_{control}$ which in turn is input into a controlled oscillator 505. The controlled oscillator will then output a signal $S_0$ with a frequency dependent upon the signal $S_{control}$ output from the DLF.

Note that in the following the phrase "temporal/phase error" and "temporal/phase difference" are used interchangeably. The BPD determines the phase difference between the signals $S_0$ and $S_{ref}$ with 1-bit resolution; that is, it can only determine the polarity of the phase difference but not the magnitude. The TDC can determine the phase difference with N-bit precision, meaning it is capable of determining the magnitude of the phase difference with a resolution that increases as N increases.

A TDC has the advantage over a BPD that it is easily configured to operate over a wide capture range. A wide capture range is useful for achieving a frequency lock when the phase of the signal output from the controlled oscillator is not close to the phase of the reference signal. This phase difference could be large if, for example, frequency lock has yet to be achieved, or if the controlled oscillator receives an instantaneous frequency kick. However, a simple TDC design often suffers from poor temporal resolution and linearity; that is, the output signal of the TDC is not linearly related to the measured phase error. Conversely, a BPD can offer very high levels of temporal resolution (0.2 ps) and high levels of gain when the phase difference between the signal generated by the controlled oscillator and the reference signal is relatively small, such as, for example, when the generated signal is locked to the reference signal. However, when the difference in phase between these signals is relatively large the gain of the BPD is reduced. Typically when the phase difference is relatively large a PLL with a TDC as a phase comparator will have a shorter lock-in time and faster step response than the corresponding PLL with a BPD as a phase comparator.

Figure 1:
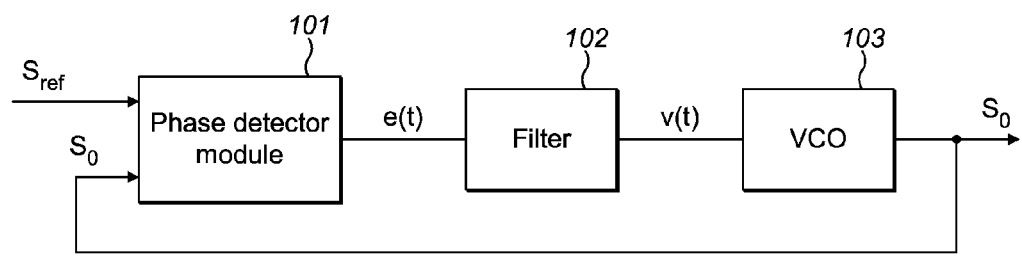
FIG. 1 is a diagram of a typical analogue phase locked loop.
Figure 2:
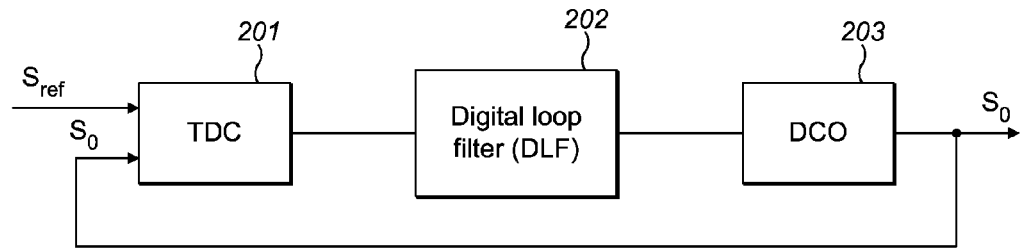
FIG. 2 is a diagram of a typical digital phase locked loop.
Figure 3A:
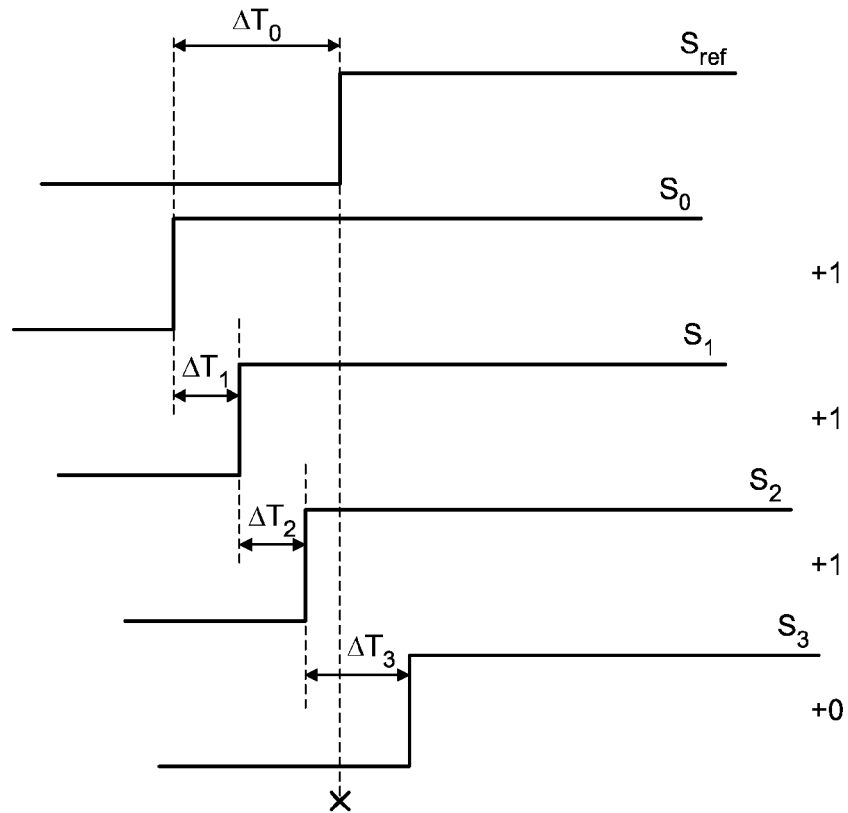
FIG. 3a is a schematic diagram illustrating how a signal is delayed relative to a reference signal in a time-to-digital converter (TDC).
Figure 3B:
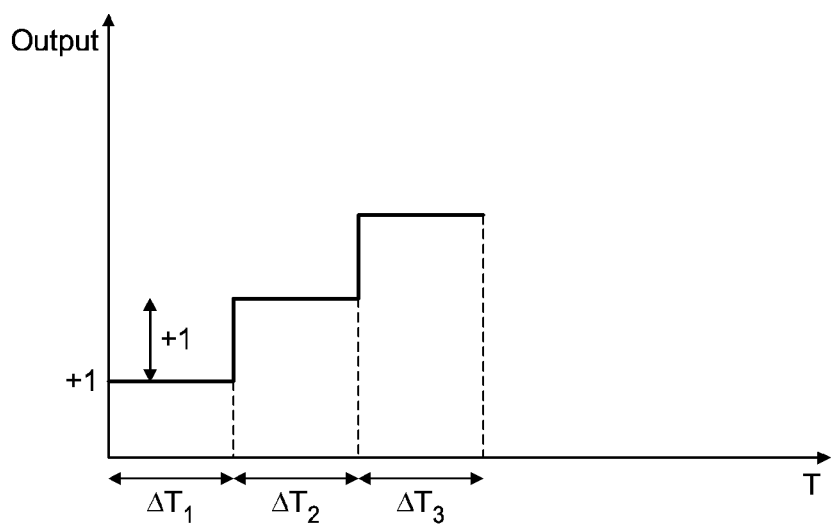
FIG. 3b is a schematic diagram of the resulting output of a TDC as a function of the measured time difference between a generated signal and a reference signal.
Figure 3C:
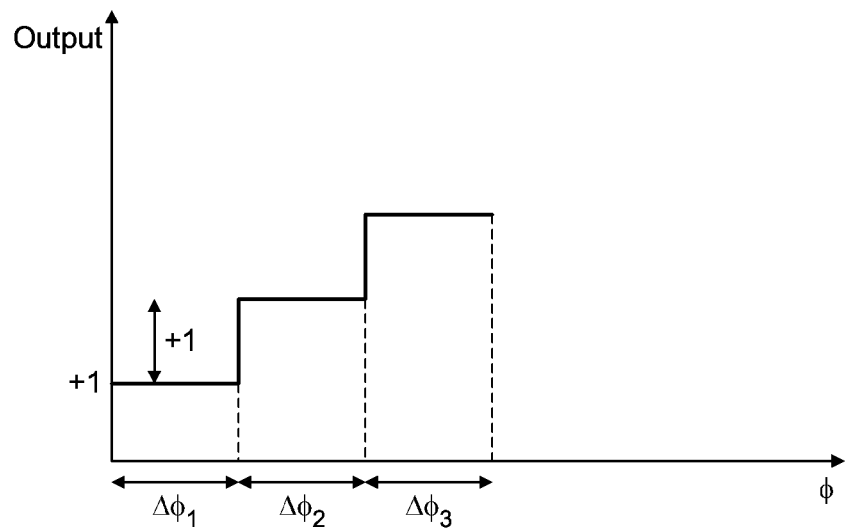
FIG. 3c is a schematic diagram of the resulting output of a TDC as a function of the phase difference between a generated signal and a reference signal.
Figure 4:
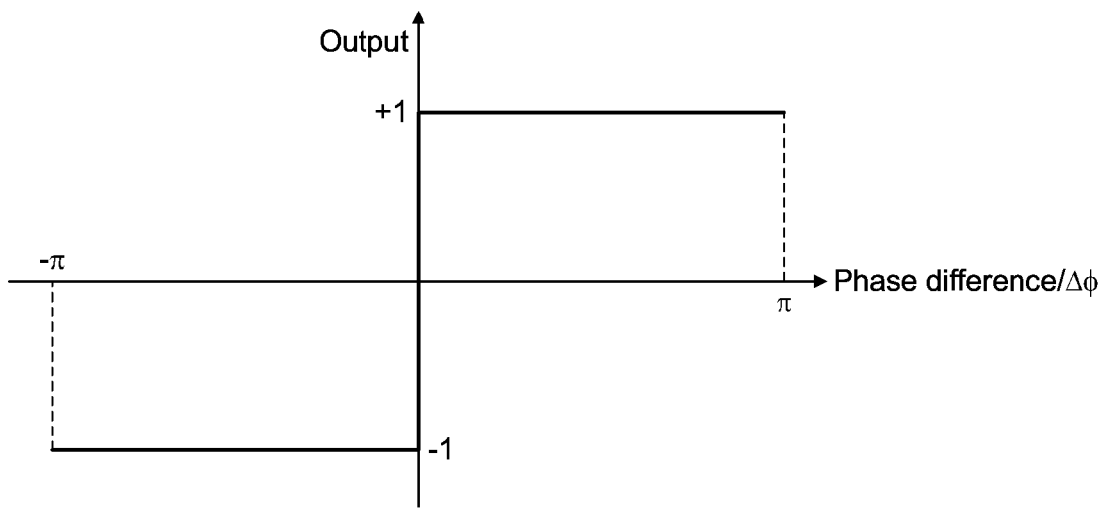
FIG. 4 is schematic diagram of the output of a binary phase detector (BPD) as a function of the measured phase difference between a generated signal and a reference signal.

Preferably, the digital output value of the TDC is equal to 1 when the measured phase/temporal error is less than a threshold value. Therefore when the measured phase error is less than this threshold value the output value of the digital multiplier is equal to the output of the BPD. This removes the effect of the TDC on the digital loop filter and controlled oscillator and so the PLL is effectively operating as if the only phase detector were a BPD. Hence, the BPD is controlling the controlled oscillator. The TDC is not controlling the controlled oscillator. The threshold value could be, for example, the resolution of the TDC for the lowest quantised phase/temporal error. As an example, the resolution of the lowest quantised phase error for a TDC with an output as shown in FIG. 3c is $\Delta\phi_1$.

If the measured phase or temporal error is larger than this threshold, the digital output value of the TDC will be greater than 1. In this case the output signal from the digital multiplier will contain information on both the magnitude of the phase error and the polarity of the error. Hence, both the TDC and the BPD are controlling the controlled oscillator. The output signal from the digital multiplier is then fed to the digital loop filter, which may be configured to have a gain which is a function of the magnitude of the phase error. Advantageously, changing the gain of the loop filter changes the bandwidth of the PLL, meaning the PLL bandwidth can be changed in dependence on the measured phase error. The DLF may be configured to have a gain that increases as the phase error increases. A PLL comprising a DLF with a gain that increases with the phase error will typically have a faster step response than a PLL comprising a DLF with a gain that is independent of the phase error.

The circuit shown in FIG. 5 has the advantage of utilising the relatively fast lock-in time and step response associated with a TDC when large phase/temporal errors are detected. Once the measured phase/temporal errors are less than the threshold value the BPD can be used to generate a signal with low phase/temporal error. The problems of poor resolution associated with the TDC are thus circumvented because it is only used to bring the measured error below a threshold value-once the error is below the threshold value the TDC has a unity output which means it does not affect the behaviour of the filter or controlled oscillator. Similarly the problems of reduced gain and relatively large lock-in times associated with a BPD when the measured error is relatively large are also circumvented because the output signal of the BPD is used in conjunction with the non-unity output of the TDC to affect the behaviour of the DLF and controlled oscillator. Preferably the resolution of the TDC is chosen such that the lowest quantised phase error is larger than the tenth standard deviation of the phase noise distribution. In practice, the signals output from either the BPD or the TDC may be input into intermediate components before the oscillator. In FIG. 5, for example, the loop filter is an intermediate component. In practice, the signal output from the oscillator may be input to intermediate components before the BPD or the TDC. For example, the signal output from the oscillator may be passed through a divider before being input to the BPD or TDC.

According to an embodiment of the invention the digital loop filter (DLF) is configured to have a gain that is a function of the error information provided by the TDC. When the TDC determines that the error is less than the threshold value the DLF may be configured to keep its gain at a constant level, which ensures it has a linear transfer function.

Figure 6:
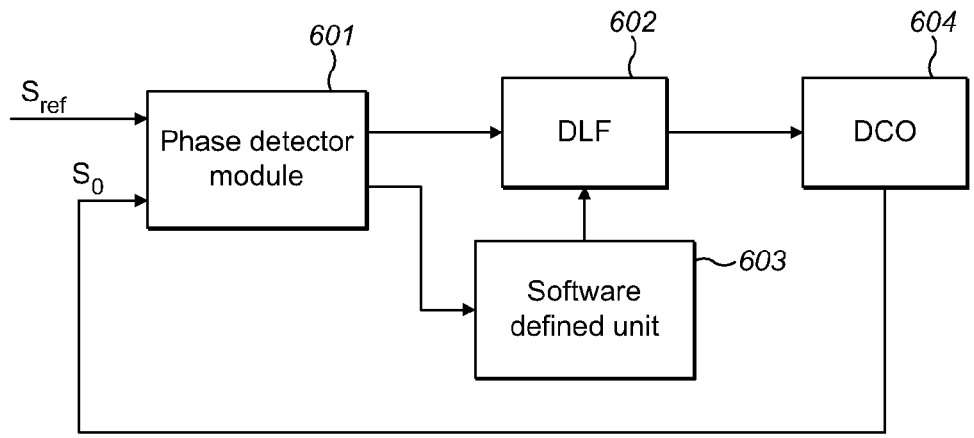
FIG. 6 is a diagram of the components used to measure the phase difference between a generated signal and a reference signal in accordance with an alternative embodiment of the present invention.

An alternative embodiment of the present invention is shown in FIG. 6. A signal output from a signal generator (e.g. a controlled oscillator) $S_O$ and a reference signal $S_{ref}$ are input into a phase detector module 601. The phase detector module could be, for example, a BPD and a TDC configured as in FIG. 5. More generally the phase detector module could be any phase detector operable to output a signal representative of the magnitude of the phase error and a signal representative of the polarity of the error. The polarity of the error is output as a signal into a digital loop filter (DLF) 602. The magnitude of the phase error between signals $S_O$ and $S_{ref}$ is output from the phase detector module as a signal which in turn is input into a software defined unit 603. The software defined unit 603 determines the gain to be applied to the DLF as a function of the phase error. The DLF outputs a signal $S_{control}$ which is input into a digitally controlled oscillator 604. The signal $S_{control}$ causes the DCO to output a signal $S_O$ with a frequency dependent upon the gain specified by the software unit 603 and the output signals of the BPD and the TDC. In this embodiment the gain of the DLF as a function of phase error can be determined by the software unit 603. Therefore the gain profile of the DLF can be altered by suitable programming of the software defined unit 603, meaning the gain profile can be changed without any changes in hardware.

Figure 7:
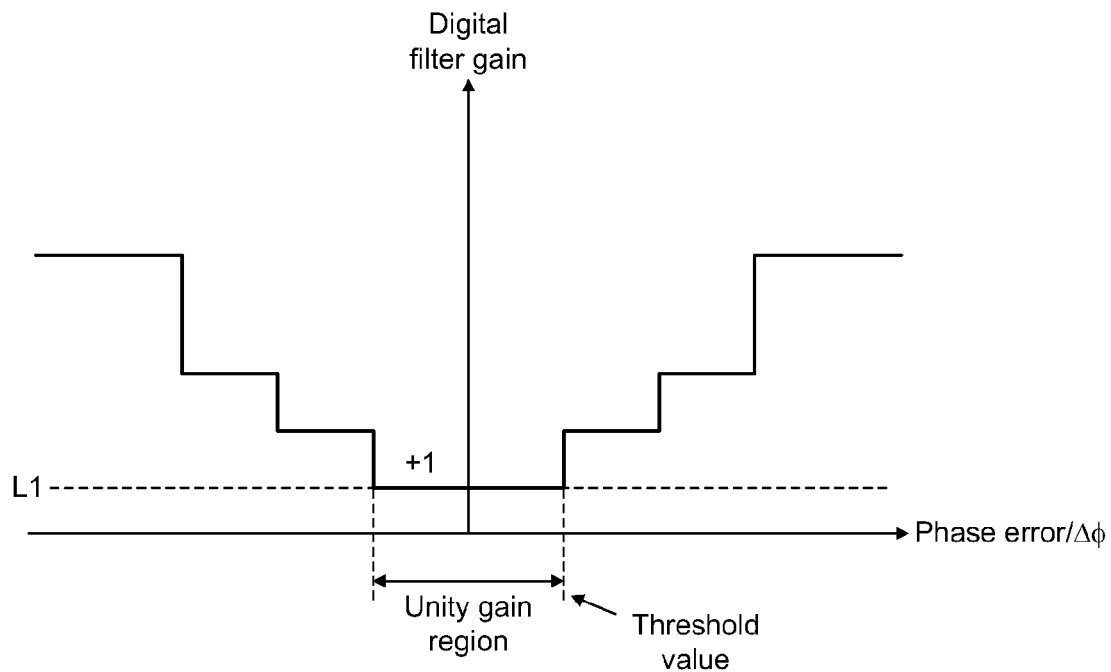
FIG. 7 is an example of the digital loop filter gain as a function of the measured phase difference between a generated signal and a reference signal.

The software unit 603 determines an appropriate gain to be applied to the DLF for each measured phase error magnitude. An example of a DLF gain profile defined by the software unit is shown in FIG. 7. In this example the gain profile is defined such that the gain is equal to unity when the PLL is operating in the phase tracking mode (i.e., when the magnitude of the measured phase error is less than the threshold value). This is defined as the unity gain region in FIG. 7. Thus when the PLL is operating in the phase tracking mode the digital loop filter gain is constant, its transfer function is linear and the PLL benefits from the high resolution and low phase noise afforded by the BPD. If the measured phase error is outside the unity gain region because, for example, the PLL is not yet locked-in or the DCO receives a frequency kick, the gain of the DLF increases with the phase error. This will result in the PLL having a faster lock-in time and step response compared to a system where the gain of the DLF is constant. As an illustration, consider the situations of a first PLL with a DLF with a uniform gain as shown by the dotted line line $L_1$ on FIG. 7 and a second PLL with a DLF with a gain that is dependent upon the phase error as shown by the solid line in FIG. 7. If the phase error is larger than the error defining the unity gain region, the gain of the second DLF will be larger than the gain of the first DLF. A larger gain will cause a larger change in the frequency of the signal output from the DCO for a given phase error and consequently it will take less time for the signal output from the DCO of the second PLL to lock back on to the reference signal. A filter gain that increases with measured phase error will result in PLLs that have faster settling behaviour compared to linear PLLs where the gain of the filter is constant.

The software defined unit 603 may be implemented using a software look-up table, whereby values of digital filter gain are stored for various values of phase error. The table may also be re-configurable. In this way DLF gain profiles may be tailored for individual applications without any change in hardware. For example, if the application of the PLL requires a particularly fast lock-in time, the software table can be configured to produce a gain profile that is an exponential function of the phase error magnitude.

By using a BPD in conjunction with a TDC in a PLL, the parameters of the PLL can be optimised with respect to both phase noise and lock in time; two requirements that are normally in conflict. Furthermore this optimisation can be achieved without the use of a linear and high resolution TDC with a wide capture range. Such TDCs are expensive to manufacture and occupy a large chip area and are power hungry. By configuring the PLL such that the TDC only controls the signal generator when the measured phase error is relatively large, the performance requirements of the TDC can be relaxed. This results in a TDC with a simpler architecture and lower power consumption. The use of a software unit that defines the filter gain as a function of phase error has the advantage that the step response of the PLL can be customised depending upon the application. The gain profile can be easily changed without any changes in hardware. In addition to altering the gain profile, the use of software allows the complete digital filter transfer function to be changed dynamically. It is also possible for the software unit to define a time variant function of the TDC magnitude input, for example the software unit may wait for specific clock cycle information before taking a specific action, or it may require the TDC magnitude to be greater than a threshold for a specific period of time before altering the gain of the DLF.

In an alternative embodiment of the present invention, the least significant bits (LSBs) of the N-bit representation of the phase error measured by the TDC are input directly into the digital loop filter instead of the 1-bit representation of the polarity of the phase error measured by the BPD. In this embodiment the remaining bits of the N-bit representation are sent to the software block to determine the gain of the DLF.

The applicant hereby discloses in isolation each individual feature described herein and any combination of two or more such features, to the extent that such features or combinations of are capable of being carried out based on the specification as a whole in light of the common general knowledge of a person skilled in the art, irrespective of whether such features or combinations of features solve any problems disclosed herein, and without limitation to the scope of the claims. The applicant indicates that aspects of the present invention may consist of any such individual feature or combinations of such features. In view of the foregoing description it will be evident to a person skilled in the art that various modifications may be within the scope of the invention.

What is claimed is:

1. A method of measuring a phase difference for use in a phase locked loop (PLL) comprising a binary phase detector (BPD), a time-to-digital converter (TDC) and a signal generator, the phase difference being that between a reference signal and a generated signal output from the signal generator, the method comprising:

inputting the reference signal and the generated signal into the TDC;

measuring the magnitude of the phase difference at the TDC;

if the measured magnitude of the phase difference is less than a threshold value, operating the PLL according to a first operational mode in which the output of the BPD controls the signal generator; and if the measured magnitude of the phase difference is greater than the threshold value, operating the PLL according to a second operational mode in which the output of the TDC and the BPD controls the signal generator, wherein the PLL further comprises a loop filter, and the method further comprises altering the gain of the loop filter in dependence on the measured phase difference, and wherein a dynamic function unit determines the gain of the loop filter as a function of the magnitude of the measured phase difference.

2. A method as claimed in claim 1, wherein the threshold value is equal to the resolution of a minimum phase difference detectable by the TDC.

3. A method as claimed in claim 2, wherein the value of the minimum phase difference is at least as great as the value of the 10th standard deviation of the PLL phase noise distribution.

4. A method as claimed in claim 1, wherein the loop filter is a digital loop filter.

5. A method as claimed in claim 1, wherein in response to the determination, the dynamic function signals the determined gain to the loop filter.

6. A method as claimed in claim 1, wherein the gain of the loop filter as a function of the determined phase difference determined by the dynamic function unit is programmable.

7. A method as claimed in claim 1, wherein the dynamic function unit determines the gain of the loop filter as a function of the measured magnitude of the phase difference using a look-up table.

8. A method as claimed in claim 7, wherein the look-up table is re-configurable.

9. An apparatus for measuring a phase difference for use in a phase locked loop (PLL) comprising a binary phase detector (BPD), time-to-digital converter (TDC) and a signal generator, the phase difference being that between a reference signal and a generated signal output from the signal generator, wherein:
the TDC is configured to receive the reference signal and the generated signal and to measure the phase difference between these signals;
if the measured phase difference is less than a threshold value, the apparatus operates the PLL according to a first operational mode in which the output of the BPD controls the signal generator; and
if the measured phase difference is greater than the threshold value, the apparatus operates the PLL according to a second operational mode in which the output of the BPD and the TDC controls the signal generator, wherein the apparatus further comprises a loop filter, the loop filter having a gain that is alterable in dependence upon the measured magnitude of the phase difference, and wherein the apparatus further comprises a dynamic function unit that determines the gain of the loop filter as a function of the measured phase difference.

10. An apparatus as claimed in claim 9, wherein the threshold value is equal to a resolution of a minimum phase difference detectable by the TDC.

11. An apparatus as claimed in claim 10, wherein the value of the minimum phase difference is at least as great as the value of the 10th standard deviation of the PLL phase noise distribution.

12. An apparatus as claimed in claim 9, wherein the loop filter is a digital loop filter.

13. An apparatus as claimed in claim 9, wherein in response to the determination, the dynamic function unit signals the determined gain to the loop filter.

14. An apparatus as claimed in claim 9, wherein the gain of the loop filter as a function of the determined phase difference determined by the dynamic function unit is programmable.

15. An apparatus as claimed in claim 9, wherein the dynamic function unit determines the gain of the loop filter as a function of the measured phase difference by using a look-up table.

16. An apparatus as claimed in claim 15, wherein the look-up table is re-configurable.

* * * * *

UNITED STATES PATENT AND TRADEMARK OFFICE
CERTIFICATE OF CORRECTION

PATENT NO. : 8,638,146 B1
APPLICATION NO. : 13/562770
DATED : January 28, 2014
INVENTOR(S) : Lamanna et al.

Page 1 of 1

It is certified that error appears in the above-identified patent and that said Letters Patent is hereby corrected as shown below:

In the Specification

In Column 2, Line 16, delete "$k_{pa}$," and insert -- $K_{pd}$, --, therefor.

In Column 7, Line 43, delete "line line $L_1$" and insert -- line $L_1$ --, therefor.

Signed and Sealed this
Twentieth Day of May, 2014

Michelle K. Lee
*Deputy Director of the United States Patent and Trademark Office*